(12) United States Patent
Toth

(10) Patent No.: US 11,796,607 B2
(45) Date of Patent: Oct. 24, 2023

(54) SENSOR, CIRCUIT BREAKER, CHARGING CABLE AND CHARGING STATION

(71) Applicant: Magnetec GmbH, Hanau (DE)

(72) Inventor: David Toth, Rodenbach (DE)

(73) Assignee: Magnetec GmbH, Hanau (DE)

( * ) Notice: Subject to any disclaimer, the term of this patent is extended or adjusted under 35 U.S.C. 154(b) by 0 days.

(21) Appl. No.: 17/762,833

(22) PCT Filed: Jun. 15, 2021

(86) PCT No.: PCT/EP2021/066052
§ 371 (c)(1),
(2) Date: Mar. 23, 2022

(87) PCT Pub. No.: WO2021/259699
PCT Pub. Date: Dec. 30, 2021

(65) Prior Publication Data
US 2023/0098196 A1    Mar. 30, 2023

(30) Foreign Application Priority Data
Jun. 22, 2020   (DE) .......................... 102020116428.9

(51) Int. Cl.
*G01R 31/52* (2020.01)
*G01R 15/18* (2006.01)
*G01R 19/10* (2006.01)
*G01R 19/165* (2006.01)
*H02H 3/34* (2006.01)

(52) U.S. Cl.
CPC ............ *G01R 31/52* (2020.01); *G01R 15/18* (2013.01); *G01R 19/10* (2013.01); *G01R 19/1659* (2013.01); *H02H 3/34* (2013.01)

(58) Field of Classification Search
CPC ........... G01R 31/52; G01R 15/18; H02H 3/34
See application file for complete search history.

(56) References Cited

U.S. PATENT DOCUMENTS 3,701,003 A * 10/1972 Anderson ............... H01F 38/30
336/175
4,280,162 A *  7/1981 Tanka .................... H02H 3/332
361/45
5,764,123 A    6/1998 Waters
(Continued)

FOREIGN PATENT DOCUMENTS

DE    19653552 A1    6/1998
DE    19710742 A1    9/1998
(Continued)

OTHER PUBLICATIONS

International Preliminary Report on Patentability, dated Dec. 14, 2021 (19 pages).
(Continued)

*Primary Examiner* — Scott Bauer
(74) *Attorney, Agent, or Firm* — Occhiuti & Rohlicek LLP

(57) ABSTRACT

A sensor includes a passage in a shield with a clear width of 25.2 to 32 mm, which provides a higher sensitivity to electrical differential current, and more particularly for determining the universal-current sensitive determination of an electric differential current. The sensor can be a part of a circuit breaker, a charging cable and a charging station.

20 Claims, 6 Drawing Sheets

(56) References Cited

U.S. PATENT DOCUMENTS

| | | | | |
|---|---|---|---|---|
| 5,770,992 A | * | 6/1998 | Waters | H01F 27/427 |
| | | | | 336/84 R |
| 2008/0129437 A1 | * | 6/2008 | Yoshizawa | H01F 41/0226 |
| | | | | 252/513 |
| 2011/0116197 A1 | | 5/2011 | Zylstra | |
| 2015/0301087 A1 | | 10/2015 | Moell et al. | |
| 2015/0355273 A1 | * | 12/2015 | Adlhoch, Jr. | G01R 31/2884 |
| | | | | 324/750.3 |

FOREIGN PATENT DOCUMENTS

| | | |
|---|---|---|
| DE | 69412149 T2 | 2/1999 |
| DE | 19822515 A1 | 12/1999 |
| DE | 102011080034 A1 | 1/2013 |
| DE | 102015218911 A1 | 1/2017 |
| DE | 102018010160 A1 | 7/2020 |
| EP | 1696444 A2 | 8/2006 |
| EP | 1840906 A1 | 10/2007 |
| JP | H07 83960 A | 3/1995 |
| JP | 2006300583 A | 11/2006 |
| JP | 2010230456 A | 10/2010 |
| JP | 2011247699 A | 12/2011 |
| WO | 2006/064920 A1 | 6/2006 |

OTHER PUBLICATIONS

International Search Report, PCT Application No. PCT/EP2021/066052, dated Oct. 7, 2021 (17 pages).

Japanese Office Action issued in JP Application No. 2022-579809 dated Jul. 3, 2023.

Non-Patent Literature Documents cited in Opposition of European Counterpart Patent 3983812, filed Jul. 6, 2023 (100 pages).

* cited by examiner

SENSOR, CIRCUIT BREAKER, CHARGING CABLE AND CHARGING STATION

This application is a US National Stage application of International Application No. PCT/EP2021/066052, filed Jun. 15, 2021, which claims the benefit of the filing date of German Application No. DE 10 2020 116 428.9, filed Jun. 22, 2020, the contents of which are hereby incorporated by reference.

The invention relates to a sensor, a circuit breaker, a charging cable and a charging station.

Sensors for determining differential currents are known in various designs and for various applications, in particular because differential currents represent a danger for people and can cause fires.

Differential currents occur if an electrical supply network, in particular an electrical circuit within an electrical supply network, has a fault, and as a result a fault current can drain off to ground, within the electrical supply network. Depending on the type and structure of the electrical supply network, differential currents may comprise alternating current components and/or direct current components.

The constant increase in the use of renewable energies, electromobility, variable-speed electrical machines, and/or the like, results in an expansion, in terms of number, of electrical systems in which AC and DC supply networks are coupled together. As a result, the direct current components of differential currents are of increasing importance.

Typically, in particular in the case of domestic electrical installation, merely an FI circuit breaker of type A is installed, which can monitor the electrical supply network inside the house for differential currents having alternating current components, but which can neither detect nor shut off direct current faults. However, the use of direct current elements is also increasing in domestic electrical installations, for example when charging an electric vehicle or as a result of the operation of solar arrays.

Therefore, in particular in the operation of a charging infrastructure or solar inverters or the like, universal-current sensitive monitoring of differential currents is required, which includes a differential current sensor, the determined measured value of which leads to shut-off of the relevant infrastructure in the event of a threshold value being exceeded.

For the operation of a charging infrastructure or of solar inverters or the like, FI circuit breakers of type B are known, which can also record and monitor direct current components of differential currents. However, FI circuit breakers of type B are comparatively particularly costly.

A universal-current sensitive differential current sensor simultaneously monitors all the currents flowing in the line conductors and the neutral conductor, and detects possible direct and alternating current faults. Depending on the application, in the event of a fault the sensor can automatically control the shut-off of the system or signal to a superordinate control unit that the switching threshold has been exceeded. Since the tolerable fault currents are very small, excellent measuring accuracy is necessary. Furthermore, personal safety requires particularly quick detection and subsequent shut-off of the entire system.

Known differential current sensors are based for example on an assembly in which magnetic core comprising an air gap is arranged around a conductor to be monitored. In the event of a current flow, a magnetic field is induced, which is conducted through the magnetic core. In the case of known assemblies, a Hall element is arranged in the air gap, which generates an output voltage depending on the magnetic field strength. A compensation winding, which is attached to the magnetic core, can be provided in order to increase the measuring accuracy. This is achieved in that the magnetic field generated by the current to be monitored is electrically compensated, and the zero position of the Hall sensor is set. In this case, the actual output signal of a sensor of this kind represents the required current in the compensation winding.

It is furthermore known to use what are known as fluxgate sensors for measuring the magnetic field generated by the current flow. In this method, a primary coil is wound around the magnetic core and actuated by means of an alternating current. An output signal, which is dependent on the differential current, is tapped by means of a secondary pick-up coil.

The object of the invention is that of providing an improvement or an alternative to the prior art.

According to a first aspect of the invention, the object is achieved by a sensor for determining an electrical differential current, in particular for the universal-current sensitive determination of a differential current, the sensor comprising a magnetic field-sensitive component, a first main winding, a test winding, and a shield,
the magnetic field-sensitive component comprising a through-opening, the through-opening of the magnetic field-sensitive component being formed, in cross section, as an oval having two axes of symmetry,
the first main winding and the test winding surrounding the magnetic field-sensitive component by means of a plurality of windings in each case,
the shield comprising a receiving space which is designed for receiving the magnetic field-sensitive component, the first main winding, and the test winding,
the receiving space of the shield being delimited, in the radial direction, by a shield outside wall and a shield inside wall,
the shield inside wall defining a through-opening of the shield, the through-opening of the shield being formed as an oval having two axes of symmetry,
the shield comprising a peripheral gap in the region of the shield inside wall,
the sensor being designed for being arranged around at least two electrical conductors,
the through-opening of the magnetic-sensitive component having at least one clear width along an axis of symmetry,
the at least one clear width being in a range between 25.2 and 32 mm, preferably in a range between 25.5 and 29 mm, and particularly preferably between 25.8 and 27 mm.

With respect to terminology, the following is explained in this case:

Firstly, it is explicitly noted that, within the context of the present patent application, indeterminate articles and numerical data, such as "one", "two", etc., are generally to be understood as "at least" specifications, i.e. as "at least one . . . ", "at least two . . . ", etc., unless it explicitly follows from the respective context, or is obvious to a person skilled in the art or is technically essential, that in that case just "exactly one . . . ", "exactly two . . . ", etc. could be meant.

Within the context of the present patent application, the term "in particular" is always to be understood to mean that an optional, preferred feature is introduced by said term. The term is not to be understood as "specifically" and not as "namely".

A "sensor" or also "detector" is a technical assembly which can record particular physical or chemical properties and/or the material state of its surroundings, either qualitatively, or quantitatively as a "measured variable". These variables are recorded by means of physical or chemical effects, and converted into an analog or digital electrical signal. A signal of this kind is also referred to as a "sensor signal".

A sensor signal is preferably proportional to a current consumption, in particular the current consumption of the test winding and/or of the first main winding and/or a second main winding. A sensor signal, in particular a sensor signal of the test winding and/or of the first main winding and/or a second main winding, can preferably be converted into a current consumption by means of a mathematical rule.

A "current consumption" is understood as the current strength which flows through the electrical circuit at a defined voltage, in particular through the test winding and/or the first main winding and/or a second main winding. It is explicitly noted that the terminology "current consumption" does not require any statement of the sign of the current. In particular, a current consumption can correspond to a positive or a negative current.

The sensor signal is preferably understood to be the current consumption of the first main winding. The current consumption of the first main winding can preferably be converted, by means of a mathematical rule, into the differential current of the electrical circuit monitored by the sensor. Said mathematical rule can preferably be determined by a calibration curve of the sensor.

An "electrical differential current" is understood to be vectorial sum of the currents of all the electrical conductors around which the sensor is arranged.

An electrical differential current can comprise an alternating current component and/or a direct current component.

A "universal-current sensitive determination" of a differential current is understood to mean that the sensor is designed to be able to determine both an alternating current component and a direct current component.

A "magnetic field-sensitive component" is understood to be a component which reacts to a magnetic field by way of a change of at least one state variable of the component.

Preferably, a magnetic field-sensitive component is understood to be a material which has magnetic properties.

A magnetic field-sensitive component is particularly preferably understood to be a magnetically soft material.

A "magnetically soft material" is understood to be a material which can be easily magnetized in a magnetic field. A magnetically soft material preferably has a coercivity of less than or equal to 1000 A/m.

The "coercivity" is understood to be the magnetic field strength which is required for fully demagnetizing a magnetic field-sensitive component which has previously been charged up to the saturation flux density.

A magnetically soft material is preferably understood to be a material which has been produced from an amorphous metal, and has a nanocrystalline structure.

In particular, a magnetically soft material comprises an alloy comprising iron, nickel and cobalt.

A "winding" is understood to be a coil, extending around a magnetic field-sensitive component, of an electrically conductive material in the solid aggregation state, in particular in the form of a wire.

A "main winding" is understood to be a winding which is designed to be actively supplied with an electrical current, by means of a current source. Alternatively, a main winding can also be connected to a voltage source. A main winding can also be referred to as a "first main winding".

A main winding, in particular a first main winding, is preferably designed to provide a sensor signal, in particular indirectly via the current consumption of the main winding, in particular indirectly via the current consumption of the first main winding and/or of the second main winding.

The differential current of the electrical circuit which is monitored, as designated, by the sensor can be determined from the current consumption of the main winding, in particular of the first and/or a second main winding, by means of a mathematical rule, preferably by means of a mathematical rule which can be derived from a calibration of the sensor.

A "test winding" is understood to be a winding which is designed for an electrical current to flow therethrough, as a purely passive component, as a result of an induction effect proceeding from the magnetic field-sensitive component. The test winding can preferably be designed to provide a test winding signal, which can be used within the context of a calibration of the sensor. In particular, the test winding preferably has a different number of turns compared with the main winding.

A calibration of the sensor is preferably performed upon each uptake of the measuring operation, before the start of the actual measuring operation.

A "shield" is understood to be a component which is designed to keep electrical and/or magnetic fields away from the magnetic field-sensitive component, and/or to protect the surroundings of the sensor from the electrical and/or magnetic fields emanating from the sensor.

The shield preferably consists of an alloy which comprises more than or equal to 20 wt. % nickel, preferably more than or equal to 30 wt. % nickel, and particularly preferably more than or equal to 50 wt. % nickel. Further preferably, the shield consists of an alloy which comprises more than or equal to 60 wt. % nickel, further preferably more than or equal to 70 wt. % nickel, and particularly preferably more than or equal to 80 wt. % nickel.

The shield preferably consists of an alloy which comprises more than or equal to 0.5 wt. % molybdenum, preferably more than or equal to 1 wt. % molybdenum, and particularly preferably more than or equal to 3 wt. % molybdenum. Further preferably, the shield consists of an alloy which comprises more than or equal to 4 wt. % molybdenum, further preferably more than or equal to 5 wt. % molybdenum, and particularly preferably more than or equal to 5.5 wt. % molybdenum.

The shield preferably consists of an alloy which comprises more than or equal to 10 wt. % iron, preferably more than or equal to 20 wt. % iron, and particularly preferably more than or equal to 30 wt. % iron. Further preferably, the shield consists of an alloy which comprises more than or equal to 40 wt. % iron, further preferably more than or equal to 50 wt. % iron, and particularly preferably more than or equal to 55 wt. % iron.

It is explicitly noted that the above values for the alloy compositions of the shield are not to be understood as strict limits, but rather should be able to be exceeded or fallen below, at an engineering scale, without departing from the described aspect of the invention. Put simply, the values are intended to provide an indication for the quantities of the alloy composition, proposed here, of the shield.

The shield is preferably formed in multiple parts, in particular in two parts.

A two-part shield is particularly preferably formed such that the two shield parts overlap, or at least partially overlap, at the shield outside wall.

More particularly preferably, a two-part shield is formed such that the two shield parts do not touch, at the shield inside wall, the two shield parts of a two-part shield further preferably forming a gap at the shield inside wall.

A "through-opening" is understood to be a free cross section which is formed in interior of the magnetic field-sensitive component.

The outer contour of the magnetic field-sensitive component is particularly preferably formed as an oval, and the inner contour of the magnetic field-sensitive component is also formed as an oval, having two axes of symmetry.

The inner contour of the magnetic field-sensitive component forms the through-opening of the magnetic field-sensitive component.

The material thickness of the magnetic field-sensitive component is preferably largely constant or constant. In the exceptional case in which the magnetic field-sensitive component is formed as a circle in cross section, and the material thickness of the magnetic field-sensitive component is constant, the magnetic field-sensitive component has the geometry of an annulus in cross section.

An "oval" is a planar, round, convex figure. An oval includes circles and ellipses as special cases, in contrast to these any oval not having to comprise an "axis of symmetry". In particular, an oval is a closed convex curve, which can be constantly differentiated twice, in a plane.

If the curve of an oval is arranged so as to be a mirror image on both sides of an imaginary line, then the oval has an axis of symmetry. If the curve of an oval is arranged so as to be a mirror image on both sides of two imaginary lines which do not coincide, then the oval has "two axes of symmetry". In particular, a circle and an ellipsis are in each case an oval having two axes of symmetry.

A "winding" is understood as an orbit of a winding around the magnetic field-sensitive component.

A "receiving space" is understood as the space which is formed by the shield in the interior of the shield, and which is designed for receiving further components, in particular the magnetic field-sensitive component, the first main winding, and the test winding, as well as preferably also a second main winding, an insulator, and a spacer ring.

A "radial direction" is understood to be a direction which extends from a central axis of the sensor, which extends normally to the smallest possible cross-sectional area of the through-opening, and extends in a straight line in the radial direction with respect to the central axis.

A "shield outside wall" is understood to be the outer surface, viewed in the radial direction, which surface is formed by the shield, in particular by a connected two-part shield.

A "shield inside wall" is understood to be the inner surface, viewed in the radial direction, which surface is formed by the shield, in particular by the projected surface which comprises possible sub-surfaces of the internal shield and of the peripheral gap.

A "peripheral gap" is understood to be a peripheral gap, in the shield inside wall, between the sub-surfaces of the shield inside wall formed by the shield. Viewed in the radial direction, and proceeding from the central axis, the peripheral gap opens the shield in the direction of the receiving space of the shield.

An "electrical conductor" is understood to be any medium that has mobile charge carriers and is thus capable of transporting an electrical charge. An electrical conductor is preferably understood to be a copper cable and/or an aluminum cable through which the electrons can move.

A "clear width" along an axis of symmetry of the through-opening is understood to be the extension of the through-opening in the direction of and at the height of the axis of symmetry considered.

If the oval that forms the through-opening of the magnetic field-sensitive component in cross section has two axes of symmetry having different extensions along the axes of symmetry, then a first clear width results along the first axis of symmetry, and a second clear width results along the second axis of symmetry.

If the present description refers merely to one clear width, then this preferably means the clear width along the axis of symmetry having the largest extension.

A "limit current" is understood to be a differential current which the sensor can record at a sufficient degree of accuracy and at sufficient speed, such that a circuit breaker can interrupt the voltage in the electrical circuit monitored by the sensor, as soon as a differential current is recorded which at least reaches or exceeds the limit current of the circuit breaker.

The smaller the limit current of a circuit breaker, and thus directly the suitability of the sensor for measuring small differential currents, and the faster this is reliably identified by the sensor, the lower the risk which may result from an arising differential current.

In the prior art, sensors are known that have a smaller clear width of the through-opening of the magnetic field-sensitive component than that proposed here.

In particular, the conventional aim is to reduce the clear width of the through-opening of the magnetic field-sensitive component.

This aim is motivated by the fact that the demand for smaller differential currents which can be recorded more quickly requires the magnetic field-sensitive component to be arranged as close as possible to the current-carrying electrical conductors of the monitored electrical circuit.

The magnetic field strength emanating from a current-carrying electrical conductor drops in a manner inversely proportional to the spacing from the current-carrying electrical conductor. Accordingly, the further the magnetic field-sensitive component is from the current-carrying electrical conductors of the monitored electrical circuit, the lower the magnetic flux density, in the magnetic field-sensitive component, brought about in the magnetic field-sensitive component by the magnetic field strength around the current-carrying electrical conductors.

In addition thereto, the magnetic field strengths of the at least two current-carrying electrical conductors of the monitored electrical circuit, which must both be guided through the through-opening of the magnetic field-sensitive component in order to monitor a differential current, and which have opposing current flow directions, overlap one another and, in an ideal view, cancel one another out, provided that no differential current appears in the monitored electrical circuit.

As a result, the magnetic field strength acting on the magnetic field-sensitive component is particularly low, in particular in the case of small differential currents in the monitored electrical circuit, as a result of which a particularly low magnetic flux density is brought about in the magnetic field-sensitive component.

The lower the flux density in the magnetic field-sensitive component, the smaller the electrical current also is, which the magnetic flux density in the magnetic field-sensitive component brings about in the test winding and/or the first main winding and/or a second main winding.

In other words, the greater the clear width of the through-opening of the magnetic field-sensitive component, the larger the spacing of the electrical conductors of the monitored electrical circuit from the magnetic field-sensitive component can also be, as a result of which a small differential current cannot be recorded at all, or can be recorded only with great difficulty.

For this reason, the demand for smaller recordable differential currents leads to the technical aspiration for the clear width of the through-opening of the magnetic field-sensitive component to be as small as possible.

A magnetic field-sensitive component that is as small as possible furthermore leads to a low weight of the sensor, a low material requirement, and thus lower costs as well as a smaller installation space requirement.

There are thus several factors which favor a smaller clear width of the through-opening of the magnetic field-sensitive component.

It is known in the prior art that circuit breakers having a very low differential current tend to activate incorrectly upon closure of the monitored electrical circuit.

The reason for this is that sensors known in the prior art generate a sensor signal, upon closure of the electrical circuit, which signal can be interpreted as a differential current, although no differential current need be present in the monitored electrical circuit. The demand for smaller differential currents results in the number of incorrect activations of circuit breakers having increased.

In laboratory tests it has now entirely unexpectedly been found, in contrast to the conventional view, that there is an optimal range of a clear width of the through-opening of the magnetic field-sensitive component, in which differential currents which are as small as possible can be recorded in sufficient time, and simultaneously the likelihood of incorrect activation of a circuit breaker connected to the sensor can be significantly reduced, the identified range requiring a larger clear width of the through-opening of the magnetic field-sensitive component than was known hitherto in the prior art.

In other words, a range of a clear width of the through-opening has been identified which allows for robust determination of a differential current which is as small as possible, such that no sensor signals, or sensor signals which occur only significantly more rarely, occur upon closure of the electrical circuit monitored by the sensor, which signals can be interpreted as a differential current and which are over the required limit current.

In order to achieve a minimum limit current in the monitored electrical circuit which can be determined in a robust manner by means of the sensor, it is proposed for the clear width of the through-opening of the magnetic field-sensitive component to be in a range between 25.2 and 32 mm.

It is preferably proposed for the clear width of the through-opening of the magnetic field-sensitive component to be in a range between 25.5 and 29 mm.

It is particularly preferably proposed for the clear width of the through-opening of the magnetic field-sensitive component to be in a range between 25.8 and 27 mm.

It is explicitly noted that the above values for the clear width of the through-opening of the magnetic field-sensitive component are not to be understood as strict limits, but rather should be able to be exceeded or fallen below, at an engineering scale, without departing from the described aspect of the invention. Put simply, the values are intended to provide an indication for the size of the clear width, proposed here, of the through-opening of the magnetic field-sensitive component.

Of course, the specified range boundaries for the clear width can also be combined with one another as desired.

Upon activation of the voltage supply at an electrical circuit to be monitored, a physical operative connection is established between the magnetic field propagating around an electrical conductor and the magnetic flux density which is operatively associated therewith.

This leads, upon activation, to brief, time-varying pulsating of the magnetic flux, which is briefly also location-dependent, in the magnetic field-sensitive component.

This briefly leads to oscillation behavior of the magnetic flux in the magnetic field-sensitive component.

This brief oscillation behavior in the magnetic field-sensitive component briefly also leads to a pulsed current flow in the test winding and/or the first main winding and/or a second main winding, which is also operatively associated with the magnetic field-sensitive component by means of induction.

Laboratory tests have shown that a sensor signal can briefly occur, as a result, which can be interpreted as a differential current, as a result of which a predefined limit current can be exceeded in the designated operation of the sensor in a circuit breaker. This can result in disconnection of the circuit breaker upon activation of the voltage supply for the electrical circuit to be monitored.

A plurality of different factors have a damping effect on this brief oscillation behavior. Some of these factors cannot be influenced by design measures.

It was found, during laboratory tests, that one of these factors is determined by the mutual spacings of the electrical conductors which are intended to be monitored by the sensor proposed here. The larger the above-described spacing or the above-described spacings, the stronger the operative association between the electrical conductors and the sensor signal upon activation of the voltage supply.

On account of existing safety concerns, ever greater spacings are required for the spacings of the electrical conductors in the cross section of the through-opening of the magnetic field-sensitive component, in order to prevent short circuits between the electrical conductors. This factor is fueled thereby, and the tendency for an undesired sensor signal upon closure of the electrical circuit is increased.

Another factor also identified in laboratory tests is to do with the ratio of the spacings of a first electrical conductor and a different electrical conductor, from a point in the magnetic field-sensitive component. The further the described ratio deviates from the number one, the greater the regional differences, occurring briefly, of the magnetic flux density in the magnetic field-sensitive component. The greater these regional differences, the more significantly the dynamic starting behavior of the sensor, upon closure of the electrical circuit, is fueled.

Extending the clear width of the through-opening of the magnetic-sensitive component makes it possible for the ratio of the spacings of a first electrical conductor and a different electrical conductor from a point in the magnetic field-sensitive component to be brought closer to the numerical value one, as a result of which a damping effect of the sensor behavior can advantageously be achieved by means of the activation effect described above.

Since extending the clear width of the magnetic field-sensitive component also leads to a reduced sensitivity for particularly small differential currents, in this case an optimal range for the clear width of the through-opening of the magnetic field-sensitive component is proposed, which takes into account both physical effects such that on the one hand a minimum differential current can be identified in sufficient time, in normal operation of the sensor, and on the other hand no sensor signal appears, upon activation of the power supply system monitored by the sensor, which results in incorrect detection of a non-existent differential current.

Specifically, it is also proposed, in this case, that the sensor be designed such that it can be arranged around all the conductors of an electrical circuit which, during normal operation, introduce an electrical current flow into the electrical circuit to be monitored, and discharge an electrical current flow into the electrical circuit to be monitored. It is in particular proposed that the sensor proposed here should not be arranged around the ground wire.

It is in particular proposed that, in the designated use in a uniphase power supply system, the sensor proposed here be arranged around the phase conductor and the neutral conductor. According thereto, in a uniphase power supply system the sensor should be arranged around two electrical conductors.

It is furthermore proposed, in the case of designated use in a three-phase power supply system, to arrange the sensor around the three phase conductors and the neutral conductor. Thus, in the case of a three-phase power supply system the sensor should be arranged around a total of four electrical conductors.

It is preferably proposed for the through-opening of the magnetic field-sensitive component to be circular in cross section, i.e. an oval having two half radii of equal lengths.

It is furthermore preferably proposed for the through-opening of the magnetic field-sensitive component to be elliptical in cross section, i.e. an oval having two half radii of different lengths.

It is explicitly noted that the feature of the through-opening of the magnetic field-sensitive component being formed, in cross section, as an oval having two axes of symmetry, is not essential within the meaning of the present invention.

Rather, in this case other geometries of the magnetic field-sensitive component are specifically also conceivable, which allow for a good compromise with respect to the above-described physical effects. These geometries are preferably also traced back to an oval cross section.

In a manner corresponding to the geometries of the magnetic field-sensitive component, it is proposed to also adjust the geometry of the shield accordingly.

It is specifically also proposed, in this case, for the magnetic field-sensitive component to have a high permeability.

"Permeability" of a magnetic field-sensitive component is to be understood as the magnetization of a material in an external magnetic field. The higher the permeability of a magnetic field-sensitive component, the higher the ratio of the magnetic flux density in the magnetic field-sensitive component and the magnetic field strength which acts on the magnetic field-sensitive component.

Thus, a magnetic field-sensitive component having a higher permeability results in a comparatively high magnetic flux density being present in the magnetic field-sensitive component, even in the case of a low magnetic field strength. Thus, a high permeability of the magnetic field-sensitive component increases the sensitivity of the sensor and in the process promotes the ability of the sensor to detect even small differential currents.

It is preferably proposed for the magnetic field-sensitive component to have a permeability that is greater than or equal to 35,000 H/m (henry per meter), the magnetic field-sensitive component preferably has a permeability of greater than or equal to 45,000 H/m, particularly preferably the magnetic field-sensitive component has a permeability of greater than or equal to 50,000 H/m. The magnetic field-sensitive component further preferably has a permeability that is greater than or equal to 60,000 H/m, the magnetic field-sensitive component preferably has a permeability of greater than or equal to 70,000 H/m, particularly preferably the magnetic field-sensitive component has a permeability of greater than or equal to 80,000 H/m. The magnetic field-sensitive component also further preferably has a permeability that is greater than or equal to 90,000 H/m, the magnetic field-sensitive component preferably has a permeability of greater than or equal to 100,000 H/m, particularly preferably the magnetic field-sensitive component has a permeability of greater than or equal to 110,000 H/m. The magnetic field-sensitive component further preferably has a permeability that is greater than or equal to 120,000 H/m, the magnetic field-sensitive component preferably has a permeability of greater than or equal to 130,000 H/m, particularly preferably the magnetic field-sensitive component has a permeability of greater than or equal to 140,000 H/m. The permeability of the magnetic field-sensitive component is preferably greater than or equal to 150,000 H/m.

The above-mentioned values for the permeability apply in the case of a magnetic field oscillating at 50 Hz.

It is explicitly noted that the above values for the permeability of the magnetic field-sensitive component are not to be understood as strict limits, but rather should be able to be exceeded or fallen below, at an engineering scale, without departing from the described aspect of the invention. Put simply, the values are intended to provide an indication for the magnitude of the permeability, proposed here, of the magnetic field-sensitive component.

The magnetic field-sensitive component preferably has a magnetic saturation flux density that is greater than or equal to 1 T, the magnetic field-sensitive component preferably has a magnetic saturation flux density of greater than or equal to 1.1 T, particularly preferably the magnetic field-sensitive component has a magnetic saturation flux density of greater than or equal to 1.2 T. The magnetic field-sensitive component preferably has a magnetic saturation flux density of greater than or equal to 1.3 T.

It is explicitly noted that the above values for the magnetic saturation flux density of the magnetic field-sensitive component are not to be understood as strict limits, but rather should be able to be exceeded or fallen below, at an engineering scale, without departing from the described aspect of the invention. Put simply, the values are intended to provide an indication for the magnitude of the magnetic saturation flux density, proposed here, of the magnetic field-sensitive component.

It is preferably proposed, here, for the magnetic field-sensitive component to exhibit a high degree of linearity with respect to the permeability, in particular a high degree of linearity with respect to the permeability as a ferrite material. In other words, it is preferably proposed for no ferrite material to be used for the magnetic field-sensitive component.

The higher the linearity with respect to the permeability of the magnetic field-sensitive component, the higher the achievable measuring accuracy of the sensor.

The magnetic field-sensitive component preferably has a coercivity that is less than or equal to 30 mA/cm, the magnetic field-sensitive component preferably has a coercivity of less than or equal to 20 mA/cm, particularly preferably the magnetic field-sensitive component has a coercivity of less than or equal to 15 mA/cm. The magnetic field-sensitive component further preferably has a coercivity of less than or equal to 10 mA/cm, the magnetic field-sensitive component preferably has a coercivity of less than or equal to 5 mA/cm, particularly preferably the magnetic field-sensitive component has a coercivity of less than or equal to 2 mA/cm. The magnetic field-sensitive component further preferably has a coercivity of less than or equal to 1 mA/cm, the magnetic field-sensitive component preferably has a coercivity of less than or equal to 0.5 mA/cm, particularly preferably the magnetic field-sensitive component has a coercivity of less than or equal to 0.2 mA/cm. The magnetic field-sensitive component preferably has a coercivity of less than or equal to 0.1 mA/cm.

The above-mentioned values for the coercivity apply in the case of a magnetic field oscillating at 50 Hz.

A low coercivity of the magnetic-sensitive component makes it possible, in particular in the case of changing field strengths of the magnetic field, to achieve a particularly high level of measuring accuracy. The lower the coercivity of the magnetic-sensitive component, the higher the measuring accuracy of the sensor.

It is explicitly noted that the above values for the coercivity of the magnetic field-sensitive component are not to be understood as strict limits, but rather should be able to be exceeded or fallen below, at an engineering scale, without departing from the described aspect of the invention. Put simply, the values are intended to provide an indication for the magnitude of the coercivity, proposed here, of the magnetic field-sensitive component.

It is preferably proposed for the magnetic field-sensitive component to be selected or produced from a magnetically soft material.

The magnetic field-sensitive component preferably consists of an alloy which comprises more than or equal to 70 wt. % iron, preferably more than or equal to 71.5 wt. % iron, and particularly preferably more than or equal to 73 wt. % iron. The magnetic field-sensitive component preferably consists of an alloy which comprises more than or equal to 73.5 wt. % iron.

The magnetic field-sensitive component preferably consists of an alloy which comprises copper in a range of 0.75 to 1.25 wt. %, preferably copper in a range of 0.85 to 1.15 wt. %, particularly preferably copper in a range of 0.95 to 1.05 wt. %. The alloy of the magnetic field-sensitive component preferably comprises copper in a fraction of 1 wt. %.

The magnetic field-sensitive component preferably consists of an alloy which comprises niobium in a range of 2 to 4 wt. %, preferably niobium in a range of 2.5 to 3.5 wt. %, particularly preferably niobium in a range of 2.8 to 3.2 wt. %. The alloy of the magnetic field-sensitive component preferably comprises niobium in a fraction of 3 wt. %.

The magnetic field-sensitive component preferably consists of an alloy which comprises boron in a range of 5 to 9 wt. %, preferably boron in a range of 6 to 8 wt. %, particularly preferably boron in a range of 6.5 to 7.5 wt. %. The alloy of the magnetic field-sensitive component preferably comprises boron in a fraction of 7 wt. %.

The magnetic field-sensitive component preferably consists of an alloy which comprises silicon in a range of 14 to 17 wt. %, preferably silicon in a range of 15 to 16 wt. %, particularly preferably silicon in a range of 15.4 to 15.6 wt. %. The alloy of the magnetic field-sensitive component preferably comprises silicon in a fraction of 15.5 wt. %.

It is explicitly noted that the above values for the alloy composition of the magnetic field-sensitive component are not to be understood as strict limits, but rather should be able to be exceeded or fallen below, at an engineering scale, without departing from the described aspect of the invention. Put simply, the values are intended to provide an indication for the quantities of the alloy composition, proposed here, of the magnetic field-sensitive component.

The magnetic field-sensitive component preferably consists of a nanocrystalline magnetically soft material having a typical grain size in the range of 5 to 30 µm, preferably of a nanocrystalline magnetically soft material having a typical grain size in the range of 7 to 20 µm, particularly preferably of a nanocrystalline magnetically soft material having a typical grain size in the range of 8 to 15 µm.

The magnetic field-sensitive component is preferably produced from a strip having a particularly low strip thickness, because in this way it is possible, according to the Maxwell equations, for the eddy current losses in the magnetic-sensitive component to be kept low.

The magnetic field-sensitive component preferably has a strip thickness in a range between 5 and 50 µm. The strip thickness of the magnetic field-sensitive component is preferably in a range between 7.5 and 40 µm, and particularly preferably between 10 and 30 µm.

It is explicitly noted that the above values for the strip thickness of the magnetic field-sensitive component are not to be understood as strict limits, but rather should be able to be exceeded or fallen below, at an engineering scale, without departing from the described aspect of the invention. Put simply, the values are intended to provide an indication for the magnitude of the strip thickness, proposed here, of the magnetic field-sensitive component.

The iron cross section of the magnetic field-sensitive component is preferably in a range between 0.03 and 0.15 cm². The iron cross section of the magnetic field-sensitive component is further preferably in a range between 0.04 and 0.12 cm². The iron cross section of the magnetic field-sensitive component is particularly preferably in a range between 0.05 and 0.1 cm².

The magnetic field-sensitive component preferably has a height of between 3 and 7 mm, the magnetic field-sensitive component preferably has a height of between 3.4 and 6.6 mm, the magnetic field-sensitive component particularly preferably has a height of between 3.8 and 6.2 mm.

It is explicitly noted that the above values for the iron cross section and the height of the magnetic field-sensitive component are not to be understood as strict limits, but rather should be able to be exceeded or fallen below, at an engineering scale, without departing from the described aspect of the invention. Put simply, the values are intended to provide an indication for the size of the iron cross section, proposed here, of the magnetic field-sensitive component.

It is preferably proposed for the sensor to determine the differential current according to the operating principle of a Foerster probe.

The number of turns of the first main winding are preferably distributed in an equidistant manner over the entire periphery of the magnetic field-sensitive component.

The first main winding preferably has a number of turns in a range between 25 and 150 turns, preferably a number of turns in a range between 35 and 135 turns, particularly preferably a number of turns in a range between 40 and 130 turns. The first main winding further preferably has a number of turns in a range between 45 and 125 turns, preferably a number of turns in a range between 50 and 120 turns, particularly preferably a number of turns in a range of 60 to 110 turns.

The number of turns of the first main winding, proposed here, advantageously makes it possible for the magnetic field-sensitive component to be wound in a manner having a spacing between the individual turns that is as equidistant as possible, in order that a magnetic flux density which is as locally homogeneous as possible is established in the magnetic field-sensitive component when the first main winding is energized.

It is explicitly noted that the above values for the number of turns of the first main winding are not to be understood as strict limits, but rather should be able to be exceeded or fallen below, at an engineering scale, without departing from the described aspect of the invention. Put simply, the values are intended to provide an indication for the quantity of the number of turns, proposed here, of the first main winding.

The number of turns of the test windings are preferably distributed in an equidistant manner over the entire periphery of the magnetic field-sensitive component.

The test winding preferably has a number of turns in a range between 3 and 40 turns, preferably a number of turns in a range between 4 and 35 turns, particularly preferably a number of turns in a range between 5 and 30 turns. The test winding further preferably has a number of turns in a range between 6 and 25 turns, preferably a number of turns in a range between 8 and 22 turns, particularly preferably a number of turns in a range of 10 to 18 turns.

The number of turns of the test winding, proposed here, advantageously makes it possible for the magnetic flux density in the magnetic field-sensitive component to be determined particularly accurately, from the inductive effect which it produced in the test winding, in particular because the test winding can be distributed homogeneously over the magnetic field-sensitive component, in a manner having equidistant spacings between adjacent turns.

It is explicitly noted that the above values for the number of turns of the test winding are not to be understood as strict limits, but rather should be able to be exceeded or fallen below, at an engineering scale, without departing from the described aspect of the invention. Put simply, the values are intended to provide an indication for the quantity of the number of turns, proposed here, of the test winding.

In an ideal functional design of the shield, the range proposed here for the through-opening of the magnetic field-sensitive component leads to a clear dimension of the through-opening of the shield that is in a range between 18.2 and 30 mm, preferably to a clear dimension of the through-opening of the shield in a range between 19.5 and 27.5 mm, and particularly preferably to a clear dimension of the through-opening of the shield in a range between 20.5 and 24.2 mm. The clear dimension of the through-opening of the shield is particularly preferably in a range between 20.8 and 22.2 mm.

It is explicitly noted that the above values for the range of the clear dimension of the through-opening of the shield are not to be understood as strict limits, but rather should be able to be exceeded or fallen below, at an engineering scale, without departing from the described aspect of the invention. Put simply, the values are intended to provide an indication for the size of the region, proposed here, of the clear dimension of the through-opening of the shield.

Of course, the specified range boundaries for the clear dimension can also be combined with one another as desired.

According to a preferred embodiment, the magnetic-sensitive component is encased by an insulator, the insulator being arranged between the magnetic-sensitive component and the first main winding, and between the magnetic-sensitive component and the test winding.

With respect to terminology, the following is explained in this case:

An "insulator" is understood to be a component consisting of a material having a particularly low electrical conductivity, such that it exhibits only an extremely low level of conductivity for an electrical current, compared with the materials surrounding it.

An insulator is preferably formed in two parts, such that it can be opened in order to receive the magnetic field-sensitive component, and subsequently closed again.

A two-part insulator preferably exhibits a form-fitting connection and/or a force-fitting connection between the two parts of the insulator, such that it can advantageously securely surround the magnetic field-sensitive component and does not inadvertently open and/or release the magnetic field-sensitive component again.

The insulator preferably has a lower hardness than the material of the winding, as a result of which possible friction between the insulator and a winding advantageously damages the insulator rather than the winding.

The insulator advantageously makes it possible to achieve a regional separation of the magnetic field-sensitive component from the first main winding and the test winding, as well as optionally the second main winding, as a result of which any occurring damage to the windings can be reduced.

If the insulator is of a lesser hardness and/or has a lower E-modulus than the material of the turns of the first main winding and test winding, and optionally of the second main winding, the turns can be laid in a manner having a preload force such that they bring about elastic deformation of the insulator, and thus a form-fitting connection between the insulator and the winding, such that the windings achieve a better degree of fixing relative to one another, as a result of which the reliability of the sensor can advantageously increase.

The insulator furthermore makes it possible for permanent constant spacing between the windings and the magnetic field-sensitive component to be achieved. As a result, it is advantageously possible for the physical operative connection between the windings and the magnetic field-sensitive component to remain constant. As a result, the precision of the determination of a sensor signal can advantageously be maintained permanently.

The sensor preferably comprises a second main winding, the second main winding surrounding the magnetic-sensitive component and/or the insulator by means of a plurality of windings.

With respect to terminology, the following is explained in this case:

A "second main winding" is understood to be a main winding which is wound around a magnetic field-sensitive component, in addition to a first main winding.

The second main winding preferably has a winding direction which differs from the winding direction of the first main winding.

In the case of the designated operation of a sensor according to the first aspect of the invention comprising a first main winding and no second main winding, the first main winding is supplied with an alternating voltage, such that the current flow in the first main winding also changes sign with every sign change of the supply voltage.

Alternatively, the first main winding is fed with a current source which reverses the current direction in an alternating manner. Using a current source advantageously makes it possible for a higher measuring accuracy of the sensor to be achieved.

In other words, in the case of the designated operation of the sensor, the first main winding has cyclically differing current flow directions.

The temporal curve of the current flow during the designated sensor operation in the first main winding can be sinusoidal or rectangular or can have another oscillation form.

The oscillating current flow in the first main winding is designed to induce a likewise oscillating magnetic flux density in the magnetic field-sensitive component.

The sensor proposed here comprises two main windings, a first and a second main winding.

The number of turns of the second main winding is preferably the same as the number of turns of the first main winding.

As a result, it is possible that an individual main winding does not need to have any sign change in the current flow direction, in order to operate the sensor in the designated manner. Rather, the two main windings can in each case be operated in a pulsed manner, such that they have a current flow and no current flow, alternately to one another.

If the two main windings are wound around the magnetic field-sensitive component in a different direction of rotation, then an alternating magnetic flux density can be induced in the magnetic field-sensitive component, in that the two main windings are connected in an alternating manner to the same voltage source or current source, it being possible for the voltage source or the current source to have a starting value that is always constant. This advantageously allows for a more favorable design of the operating circuit for the designated sensor operation. Even if an additional main winding is required, a reduction of the overall costs for the sensor and operating circuit can nonetheless be achieved as a result.

The number of turns of the second main winding are preferably distributed in an equidistant manner over the entire periphery of the magnetic field-sensitive component.

The second main winding preferably has a number of turns in a range between 25 and 150 turns, preferably a number of turns in a range between 35 and 135 turns, particularly preferably a number of turns in a range between 40 and 130 turns. The second main winding further preferably has a number of turns in a range between 45 and 125 turns, preferably a number of turns in a range between 50 and 120 turns, particularly preferably a number of turns in a range of 60 to 110 turns.

The number of turns of the second main winding, proposed here, advantageously makes it possible for the magnetic field-sensitive component to be wound in a manner having a spacing between the individual turns that is as equidistant as possible, in order that a magnetic flux density which is as locally homogeneous as possible is established in the magnetic field-sensitive component when the second main winding is energized.

It is explicitly noted that the above values for the number of turns of the second main winding are not to be understood as strict limits, but rather should be able to be exceeded or fallen below, at an engineering scale, without departing from the described aspect of the invention. Put simply, the values are intended to provide an indication for the quantity of the number of turns, proposed here, of the second main winding.

According to a particularly expedient embodiment, the sensor comprises a spacer ring, the spacer ring being arranged between the shield inside wall and the first main winding.

With respect to terminology, the following is explained in this case:

A "spacer ring" is understood to be an annular component which is designed to be arranged between the shield inside wall and the first main winding of the sensor.

A spacer ring is preferably designed to reduce or fill the radial gap in the receiving space between the shield inside wall and the main winding.

A spacer ring is preferably designed to fill the axial gap between a first shield part and a second shield part, such that the spacer ring can define the width of the peripheral gap, as soon as the two shield parts are each arranged so as to adjoin the spacer ring.

The spacer ring preferably consists of plastics material or another material having a comparatively low specific conductivity.

The spacer ring advantageously also makes it possible to achieve protection of the wires of the main winding and/or of the test winding during assembly of the sensor.

Thus, the spacer ring together with the magnetic field-sensitive component around which the main winding or the main windings and the test winding are already wound can in particular be inserted into a first part of the shield, in particular the part of the shield which is preferably overlapped by another part of the shield at its outer surface, at least in part. Thus, the magnetic field-sensitive component can be carefully inserted into the first part of the shield, under visual control, the magnetic field-sensitive component being protected, on the inside thereof, against mechanical stresses, by means of the spacer ring, in particular the windings arranged around the magnetic field-sensitive component are protected by the spacer ring, on the inside, from mechanical stresses. Subsequently, the second part of the shield can be fitted such that the windings are already protected from mechanical stresses, by means of the spacer ring and the overlapped first part of the shield. In this respect, the mechanical protection of the sensitive components can advantageously already be improved by the spacer ring, even in the event of a lack of optical accessibility of the particularly sensitive components during assembly of the second part of the shield.

In this case, a spacer ring is preferably proposed which comprises, in the interior of the basic material thereof, an insert that consists of a material having a comparatively high permeability, in particular a permeability which substantially corresponds to the permeability of the shield. Said insert is preferably entirely surrounded by the basic material of the spacer ring, in order that it is insulated by means of the basic material that has the comparatively low electrical conductivity.

It is thereby advantageously possible that the leakage, at the peripheral gap, of the magnetic field emanating from the magnetic field-sensitive component during the designated operation of the sensor, can be reduced as a result of the higher permeability of the spacer ring, as a result of which the measuring accuracy of the sensor can advantageously be increased, and the energy requirement of the sensor can also be reduced.

The shield optionally comprises a coating, in particular an electrically insulating coating.

With respect to terminology, the following is explained in this case:

A "coating" is understood to be an adherent layer of a formless material on the surface of the shield.

A coating is preferably designed so as to have particularly low conductivity for an electrical current. A coating thus preferably has a particularly low degree of electrical conductivity.

A coating preferably consists of an epoxy resin.

The coating is preferably applied to the shield such that it covers at least the partial surface of the outer shield surface, which is arranged, as designated, in the vicinity of a circuit board.

It is thus advantageously possible for insulation of the shield to be achieved with respect to a designated circuit board, such that a short circuit between the shield and the designated circuit board can advantageously be prevented.

According to an expedient embodiment, the shield has a material thickness in a range between 0.25 mm and 0.45 mm, preferably in a range between 0.3 mm and 0.4 mm, and particularly preferably in a range between 0.32 mm and 0.38 mm.

With respect to terminology, the following is explained in this case:

A "material thickness" is understood to be the extension of a body in the direction of the surface normals thereof.

An "eddy current" is understood to be a current which is induced in an extended electrical conductor in a temporally varying magnetic field, and/or in a moving conductor in a temporally constant, but spatially inhomogeneous, magnetic field. If the conductor has a finite electrical resistance, then it heats up as a result of the eddy current. This amount of energy, converted into heat, is referred to as the "eddy current loss".

In this case it is proposed that the material thickness of a shield of a magnetic field-sensitive component, together with the at least one main winding and the test winding around the magnetic field-sensitive component, be reduced.

The possibility for reducing the material thickness in the region of the shield is based on an innovation in the field of production of the shield.

The shield is preferably deep-drawn or injection-molded.

As a result, it is advantageously possible for a cost saving to be achieved compared with a greater material thickness of the shield.

In the case of the designated operation of the sensor, the magnetic field-sensitive component has an oscillating magnetic flux density. Since the shield also consists of a material having good electrical conductivity, it experiences an inductive effect on account of the change in the magnetic flux density of the magnetic field-sensitive component. Said inductive effect is undesired, since eddy current losses occur as a result.

A reduction in the material thickness of the shield makes it possible for the eddy current losses resulting during the designated operation of the sensor to advantageously be reduced.

As a result, the energy requirement of the sensor can advantageously be reduced, and the measuring accuracy of the sensor increased.

It is explicitly noted that the above values for the material thickness of the shield are not to be understood as strict limits, but rather should be able to be exceeded or fallen below, at an engineering scale, without departing from the described aspect of the invention. Put simply, the values are intended to provide an indication for the magnitude of the material thickness, proposed here, of the shield.

The peripheral gap preferably has a gap width in a range between 0.1 mm and 2.0 mm, preferably in a range between 0.3 mm and 1.7 mm, and particularly preferably in a range between 0.6 mm and 1.3 mm.

With respect to terminology, the following is explained in this case:

A "gap width" is understood to be the width of a gap. The width of the gap is preferably understood to be the width of the peripheral gap on the shield inside wall of the shield.

A peripheral gap in the shield is particularly advantageous, since the shield would otherwise would also constitute a winding, around the magnetic field-sensitive component, of a material having good electrical conductivity, which winding, in the designated operation of the sensor, in which the magnetic flux density oscillates in the magnetic field-sensitive component, would experience a stronger inductive effect. As a result, there would be an increase in the eddy current losses in connection with the shield, which can lead to a higher energy requirement of the sensor and to a reduced measuring accuracy of the sensor.

However, a peripheral gap in the shield of the sensor subsequently also leads to a sink in the magnetic field around the magnetic field-sensitive component, in particular because the permeability of air in the peripheral gap is significantly lower than the permeability of the shield.

Thus, too large a width of the peripheral gap also leads to different physical effects, which also have a negative impact on the energy requirement of the sensor, and the measuring accuracy of the sensor.

In this case, only one specific range for the gap width of the peripheral gap is proposed, as a result of which it is advantageously possible to achieve an optimum between the optimally sensitive measuring accuracy of the sensor, on the basis of different physical effects, associated with too small a width of the peripheral gap and with too large a width of the peripheral gap.

Furthermore, the width, proposed here, of the peripheral gap makes it possible that the energy requirement for the operation of the sensor can advantageously be minimized.

It is explicitly noted that the above values for the gap width of the peripheral gap are not to be understood as strict limits, but rather should be able to be exceeded or fallen below, at an engineering scale, without departing from the described aspect of the invention. Put simply, the values are intended to provide an indication for the size of the gap width, proposed here, of the peripheral gap.

According to an expedient embodiment, the sensor comprises an electrical connector, the electrical connector comprising a support plate, a connector neck, and a plurality of electrical contacts, the electrical connector comprising two electrical contacts, at least for each winding, the electrical contacts being arranged outside the shield outside wall, in the radial direction, the support plate being arranged between the shield outside wall and the first main winding, the connector neck extending through an opening in the shield outside wall and interconnecting the support plate and the electrical contacts, the support plate and the connector neck each comprising a corresponding recess, the recess being designed for receiving the two electrical wires, which are operatively connected to each winding, from the receiving space, and guiding these to the electrical contacts, from the receiving space and through the opening in the shield outside wall, the recess comprising a notch, in a direction in parallel with the shield outside wall, through which notch the electrical wires can be inserted into a central region of the recess.

With respect to terminology, the following is explained in this case:

An "electrical connector" is understood to be a component which is designed to be fastened to the sensor, and comprises at least the necessary number of accessible electrical contacts.

The connector preferably makes it possible for the electrical and/or electronic components of the sensor to be able to be electrically connected to the electrical contacts of the connector, the electrical contacts of the connector having a relatively good degree of accessibility.

The connector preferably makes it possible, at least indirectly, for the electrical contacts to be able to be arranged so as to be stationary, relative to the sensor.

Overall, the connector thus preferably and advantageously makes it possible for the sensor to be able to be inserted, in a manner having a fixed relative arrangement, between the magnetic field-sensitive component and the electrical contacts, it being possible for the electronic and/or electrical components of the sensor to already be electrically connected to the electrical contacts during production of the sensor.

Thus, the sensor can advantageously be connected to a board directly by means of soldering, or indirectly by means of a different contact element, in particular a plug, by means of the electrical contacts of the electrical connector, in particular such that the relative position of the magnetic field-sensitive component with respect to a board can be fixed by the connection which is made possible at least indirectly by the electrical connector.

As a basic material, the electrical connector preferably comprises a plastics material, in particular a plastics material having a relatively low electrical conductivity.

The electrical contacts of the electrical connector are preferably surrounded by the basic material of the connector, at least in part, such that a force-fitting and/or a form-fitting connection exists between the basic material and the electrical contacts. Further preferably, the electrical contacts are arranged so as to be spatially separated from one another by the basic material of the electrical connector, as a result of which it is advantageously possible for there to be no direct electrical contact between two electrical contacts, such that a short circuit between the individual electrical and/or electronic components of the sensor can be prevented.

A "support plate" is understood to be a region of the electrical connector which is designed for form-fitting and/or force-fitting, at least indirect, connection between the magnetic field-sensitive component and the electrical connector.

The support plate can preferably be arranged inside the receiving space of the shield, in particular between the shield and the main winding, preferably between the main winding and the shield outside wall of the shield.

The support plate if preferably designed to be introduced, together with the magnetic field-sensitive component and the windings surrounding the magnetic field-sensitive component, into the shield. As a result, an additional protection of the windings from mechanical stresses during installation in the shield can advantageously be achieved by the support plate.

A "connector neck" is understood to be a region of the electrical connector which is designed to interconnect the support plate and the electrical contacts.

An "electrical contact" is understood to be a component of the electrical connector which is designed for contacting between the electrical and/or electronic components of the sensor.

An electrical contact is preferably designed such that it protrudes in two directions, from the basic material of the electrical connector. In this case, it should in particular be considered that contacting between the electrical and/or electronic components of the sensor, and the electrical contact, can be carried out at a protruding end of the electrical contact. It should furthermore be considered that contacting with an operating circuit for the sensor can be carried out at a different protruding end of the electrical contact, in particular by means of soldering or by means of a plug-in connector that corresponds to the electrical contact or to a plurality of electrical contacts.

An electrical contact preferably consists of an alloy which comprises nickel in a range between 17 and 19 wt. %, preferably nickel in a range between 17.5 and 18.5 wt. %, and particularly preferably 18 wt. % nickel.

An electrical contact preferably consists of an alloy which comprises zinc in a range between 18 and 22 wt. %, preferably zinc in a range between 19 and 21 wt. %, and particularly preferably 20 wt. % zinc.

An electrical contact preferably consists of an alloy which comprises more than or equal to 58 wt. % copper, preferably more than or equal to 60 wt. % copper, and particularly preferably more than or equal to 61 wt. % copper. An electrical contact further preferably consists of an alloy which comprises more than or equal to 62 wt. % copper, further preferably more than or equal to 63 wt. % copper, and particularly preferably more than or equal to 64 wt. % copper.

The above-described alloy composition for the electrical contacts advantageously allows for a very good electrical conductivity at a simultaneously comparatively high modulus of elasticity and very good tin plating properties and soldering properties.

It is explicitly noted that the above values for the alloy compositions of an electrical contact are not to be understood as strict limits, but rather should be able to be exceeded or fallen below, at an engineering scale, without departing from the described aspect of the invention. Put simply, the values are intended to provide an indication for the quantities of the alloy composition, proposed here, of an electrical contact.

An electrical contact preferably comprises a gold coating, as a result of which the electrical conductivity of the electrical contact can advantageously be improved.

An "opening" is understood to be a region in the shield through which the connector neck of the electrical connector, which interconnects the support plate and the electrical contacts, can extend from the receiving space inside the shield into a region outside of the shield, such that the electrical contacts of the electrical connector can be arranged outside of the shield. For this purpose, the shield preferably comprises an opening that corresponds to the connector neck.

In the case of a two-part shield, it should be considered that one or both parts of the shield comprise a recess, which form the opening following joining of the shield parts.

The opening is preferably located in the region of the shield outside wall.

A "recess" is understood to be a region in the cross section of a component which is not formed by the basic material of the component and through which other bodies can thus penetrate without having to damage the component in the process.

A recess is preferably a channel through the basic material of the component.

Further preferably, a recess in the form of a sink is formed in the basic material of the component, such that another body can be inserted into the recess through the opening of the sink.

A "corresponding recess" in the connector neck and the support plate is understood to mean that the recess extends both through the support plate and through the connector neck, in a manner having a substantially constant course in the main extension direction of the recess.

An "electrical wire" is understood to be a metal that is thin and flexible with respect to the longitudinal extension thereof. An electrical wire preferably has a circular cross section. An electrical wire preferably comprises a plurality of strands. A wire preferably has a high copper fraction.

A "notch" is understood to be a tapering or wedge-shaped incision.

Sensors according to the first aspect of the invention comprise a plurality of electrical and/or electronic components. During the designated operation of the sensor, currents appear in the electronic and/or electrical components or are actively fed into the components.

Said electrical and/or electronic components of the sensor are arranged in the receiving space of the shield in a designated manner, and have to be electrically contacted from outside of the shield.

The simplest form of the electrical contacting is based on electrical wires, which are connected to the electrical and/or electronic components, being guided through the shield towards the outside, and being soldered, externally, to a circuit board, which comprises the operating circuit for the sensor.

In the case of said soldering, a plurality of different potential sources of harm for the electrical wires, and thus also for the sensor overall, results, which can lead to failure of the sensor. On account of mechanical stresses, the electrical wires, which usually have only a very small conductor cross section, can be easily destroyed, in particular by shearing loads in the region of the shield, or by tensile loads between the windings and the connection of the electrical wires to the circuit board. Tensile loads of this kind may arise during the assembly of the sensor or also during operation of the sensor, if relative movements between the magnetic field-sensitive component and the contacting between the between the electrical wires and the circuit board occur.

In this case, it is proposed to make the electrical wires of the sensor connectable mechanically and also electrically, by means of an electrical connector, and thus to advantageously increase the robustness and the availability of the sensor.

The electrical connector proposed here comprises a support plate which is arranged in the interior of the receiving space of the shield. The connector neck extends, proceeding from the support plate, as a second region of the electrical connector. The connector neck extends in particular through the shield, in particular in the region of the shield outside wall. A plurality of electrical contacts adjoins the connector neck, which contacts are designed for electrically contacting the electrical and/or electronic components of the sensor.

The support plate allows for a force-fitting and/or form-fitting connection of the electrical connector to the sensor, in particular to the shield of the sensor.

The connector neck is designed to receive the electrical wires and to thus protect them from mechanical stresses, in particular in the region of the shield. For this purpose, the connector neck and the support plate comprise a corresponding recess, into which the electrical wires can be introduced and which protects the electrical wires from an external mechanical stress.

Furthermore, the connector neck specifies the relative position between the magnetic field-sensitive component of the sensor and the electrical contacts that are designed for electrical contacting. The electrical wires can be guided through the corresponding recess in the connector neck and the support plate, as far as the electrical contacts, and can be connected, there, to the electrical contacts for the purpose of contacting.

The corresponding recess in the connector neck and the support plate is made in the form of a depression which is open in a direction transversely to the longitudinal extension direction of the corresponding recess, such that the electrical wires can be introduced into the recess both in the longitudinal direction and transversely to the longitudinal direction. This design allows for advantages when assembling the sensor, since the wires can be introduced into the recess both gradually, individually, and bundled, both in the longitudinal direction and transversely to the longitudinal direction, which makes it significantly easier to lay the electrical wires in the recess.

The corresponding recess in the connector neck and the support plate comprises a notch which extends transversely to the longitudinal axis of the corresponding recess, and the tip of the notch facing in the direction of the recess. The notch makes it possible to insert electrical wires transversely into the recess, individually or in bundles, in a simple manner, it being necessary, in the process, for each individual electrical wire to pass the notch at the constriction thereof. In this case, the constriction of the notch is designed such that an electrical wire, once inserted into the recess, can leave the recess again, transversely to the longitudinal direction of the recess, only with significant effort, and thus remains in the protective region of the recess, in a designated manner. As a result the sequential mounting of the electrical wires can be simplified, and it is possible to ensure that an electrical wire is protected, from all sides, against mechanical stresses, directly after being inserted into the recess.

According to a second aspect of the invention, the object is achieved by a circuit breaker for interrupting an electrical circuit in the case of differential currents in the electrical circuit exceeding a threshold value, comprising a sensor according to the first aspect of the invention, an operating circuit, an electronic data processing and analysis unit, and a switching apparatus, the sensor being arranged around at least two electrical conductors which form an electrical circuit,
the switching apparatus being designed for interrupting the electrical circuit,
the operating circuit being designed for operating the sensor,
the electronic data processing and analysis unit being designed for analyzing sensor signals of the sensor,
the electronic data processing and analysis unit being designed, upon identification of an electrical differential current, in particular in the case of universal-current sensitive identification of a differential current, having a current strength greater than a threshold value, in particular an adjustable threshold value, to actuate the switching apparatus such that the switching apparatus interrupts the electrical circuit.

With respect to terminology, the following is explained in this case:

A "circuit breaker" is understood to be a device which is designed, upon a defined differential current being exceeded, in particular upon an adjustable differential current being exceeded, in the electrical circuit monitored by the circuit breaker, to disconnect the voltage of the monitored electrical circuit. In this way, the risk of differential currents for people and infrastructure can advantageously be reduced.

An "operating circuit" is understood to be a circuit for active or passive operation of the sensor. An operating circuit is preferably designed for supplying the first main winding and/or the second main winding of a sensor with a voltage.

Furthermore, an operating circuit is preferably designed to tap the voltage at the test winding of the sensor and to forward it, as a signal, to the data acquisition and analysis unit.

The operating circuit is likewise preferably designed to tap the voltage at the first main winding and/or the second main winding of the sensor and to forward it, as a signal, to the data acquisition and analysis unit.

It should preferably also be considered that the operating circuit comprises a current consumption measuring device which is designed for assessing the current consumption of the test winding and/or of the first main and/or of a second main winding.

An "electronic data processing and analysis unit" is an electronic unit which handles volumes of data in an organized manner, and in the process pursues the aim of obtaining information on said volumes of data or of changing said volumes of data. In this case, the data are recorded in datasets, processed manually or by machine according to a specified method, and output as a result.

"Data" are understood in particular to be measured values, in particular sensor signals, or other values of physical or chemical measured variables or quantities.

A "switching apparatus" is understood to be an apparatus which is designed to disconnect the voltage supply for an electrical circuit, in particular the electrical circuit monitored by the circuit breaker.

An "electrical circuit" is understood to be an electrical circuit consisting of a system of conductors which represents a closed path.

A "sensor signal" is understood to be a state variable provided by the sensor. In particular, a sensor signal is designed such that a differential current in the electrical circuit monitored by the sensor can be concluded from the sensor signal, by means of a physical and/or chemical dependency. The differential current in the electrical circuit monitored by the sensor can preferably be calculated directly from the sensor signal. The sensor signal is preferably a determinable current strength and/or a determinable voltage.

The "current strength" is understood to be the electrical current strength, which measures the electrical current in the form of a physical variable, in particular the electrical current in an electrical circuit. In this case, the current strength refers to a suitably oriented surface, preferably the cross-sectional area of an electrical conductor. In this case, the current strength is the charge quantity flowing through the cross section and based on the time period considered.

A sensor signal is preferably understood to be the current consumption of the first main winding, which can be converted into a differential current by means of a mathematical rule.

A "threshold value" is understood to be a defined value of a state variable, in particular of the differential current, after exceeding of which threshold value in the electrical circuit monitored by the circuit breaker, the switching apparatus must, at the latest, disconnect the voltage supply of the electrical circuit monitored by means of the circuit breaker. The threshold value of the circuit breaker can preferably be adjustable.

Thus, specifically, in this case, a circuit breaker is proposed which uses a sensor according to the first aspect of the invention, for monitoring the electrical circuit.

Of course, the advantages of a sensor for determining an electrical differential current according to the first aspect of the invention, as described above, extend directly to a circuit breaker comprising a circuit breaker according to the first aspect of the invention.

In particular, it is advantageously possible, as a result, to achieve a circuit breaker having greater sensitivity for differential currents, such that the circuit breaker can already break the electrical circuit in the case of very low differential currents in the monitored electrical circuit. Furthermore it is simultaneously advantageously possible, in this case, for the circuit breaker to have a particularly low likelihood of incorrect detection of a differential current allegedly exceeding a limit current when a monitored electrical circuit is closed.

It is explicitly noted that the subject matter of the second aspect can advantageously be combined with the subject matter of the preceding aspect of the invention, specifically both individually and cumulatively in any desired combination.

According to a third aspect of the invention, the object is achieved by a charging cable for charging an electric vehicle, the charging cable comprising a sensor according to the first aspect of the invention, and/or a circuit breaker according to the second aspect of the invention.

With respect to terminology, the following is explained in this case:

A "charging cable" is understood to be an electrical connection which is designed for connecting an electric vehicle to a current source, the charging cable being designed for charging a traction battery of the electric vehicle. The charging cable preferably comprises a monitoring device for possible differential currents.

An "electric vehicle" is understood to be a vehicle that is driven by an electric motor, at least in part. An electric vehicle is preferably not bound to a rail, or at least not permanently railbound.

In this case, a charging cable for charging a battery of an electric vehicle is proposed, which charging cable comprises a circuit breaker according to the second aspect of the invention and/or a sensor according to the first aspect of the invention.

Of course, the advantages of a sensor for determining an electrical differential current according to the first aspect of the invention, and/or a circuit breaker for breaking an electrical circuit in the event of differential currents in the electrical circuit which exceed a threshold value, according to the second aspect of the invention, as described above, extend directly to a charging cable for charging an electric vehicle, the charging cable comprising a sensor according to the first aspect of the invention and/or a circuit breaker according to the second aspect of the invention.

It is explicitly noted that the subject matter of the third aspect can advantageously be combined with the subject matter of the preceding aspect of the invention, specifically both individually and cumulatively in any desired combination.

According to a fourth aspect of the invention, the object is achieved by a charging station for charging electric vehicles, the charging station comprising a sensor according to the first aspect of the invention, and/or a circuit breaker according to the second aspect of the invention.

With respect to terminology, the following is explained in this case:

A "charging station" or a "wall charging station" is understood to be a charging unit for charging electric vehicles. In the case of a wall charging station, the charging station is in particular designed to be fastened to a wall. A charging station is preferably a mobile device which can be erected in a variable manner, at different locations. In addition to a plug connection for a charging cable for connecting the charging station to the electric vehicle, and a connection to the electrical supply network, a charging station or a wall charging station preferably also provides further functions, in particular a monitoring device for possible differential currents.

In this case, a charging station for charging an electric vehicle is proposed, which charging cable comprises a circuit breaker according to the second aspect of the invention and/or a sensor according to the first aspect of the invention.

Of course, the advantages of a sensor for determining an electrical differential current according to the first aspect of the invention, and/or a circuit breaker for breaking an electrical circuit in the event of differential currents in the electrical circuit which exceed a threshold value, according to the second aspect of the invention, as described above, extend directly to a charging station for charging electric vehicles, the charging station comprising a sensor according to the first aspect of the invention and/or a circuit breaker according to the second aspect of the invention.

It is explicitly noted that the subject matter of the fourth aspect can advantageously be combined with the subject matter of the preceding aspect of the invention, specifically both individually and cumulatively in any desired combination.

Further advantages, details and features of the invention can be found in the following, from the explained embodiments. In the figures, in detail:

Figure 3:
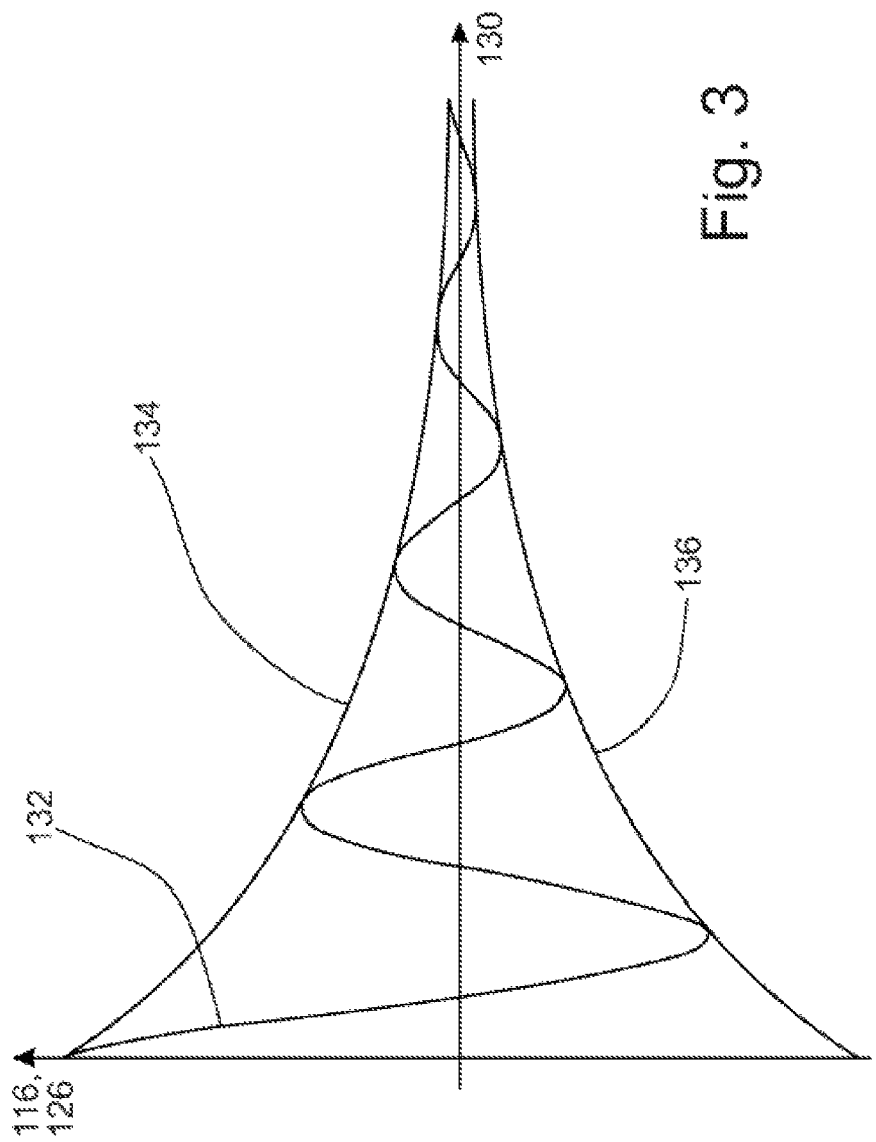
Figure 4:
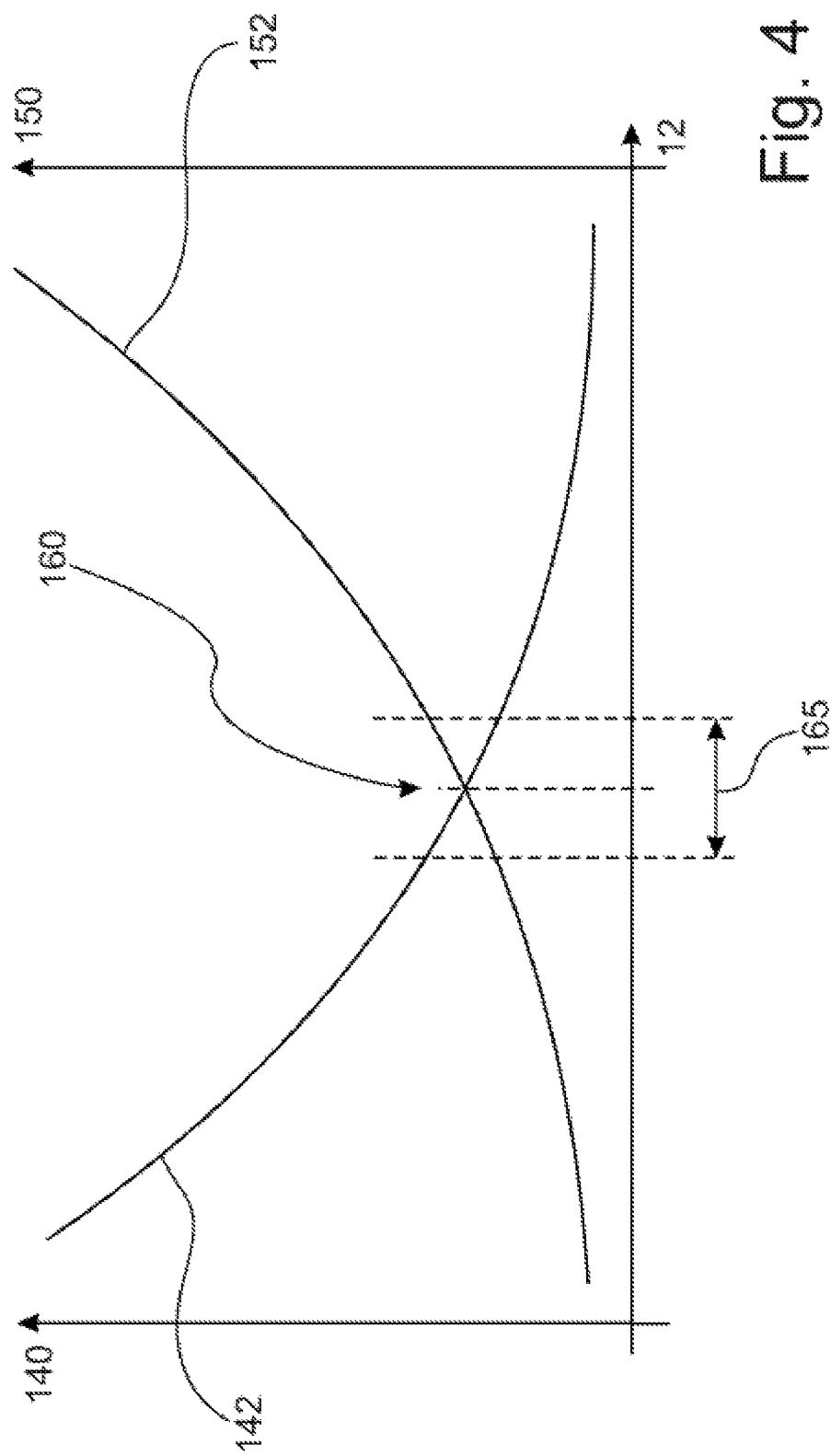
Figure 5:
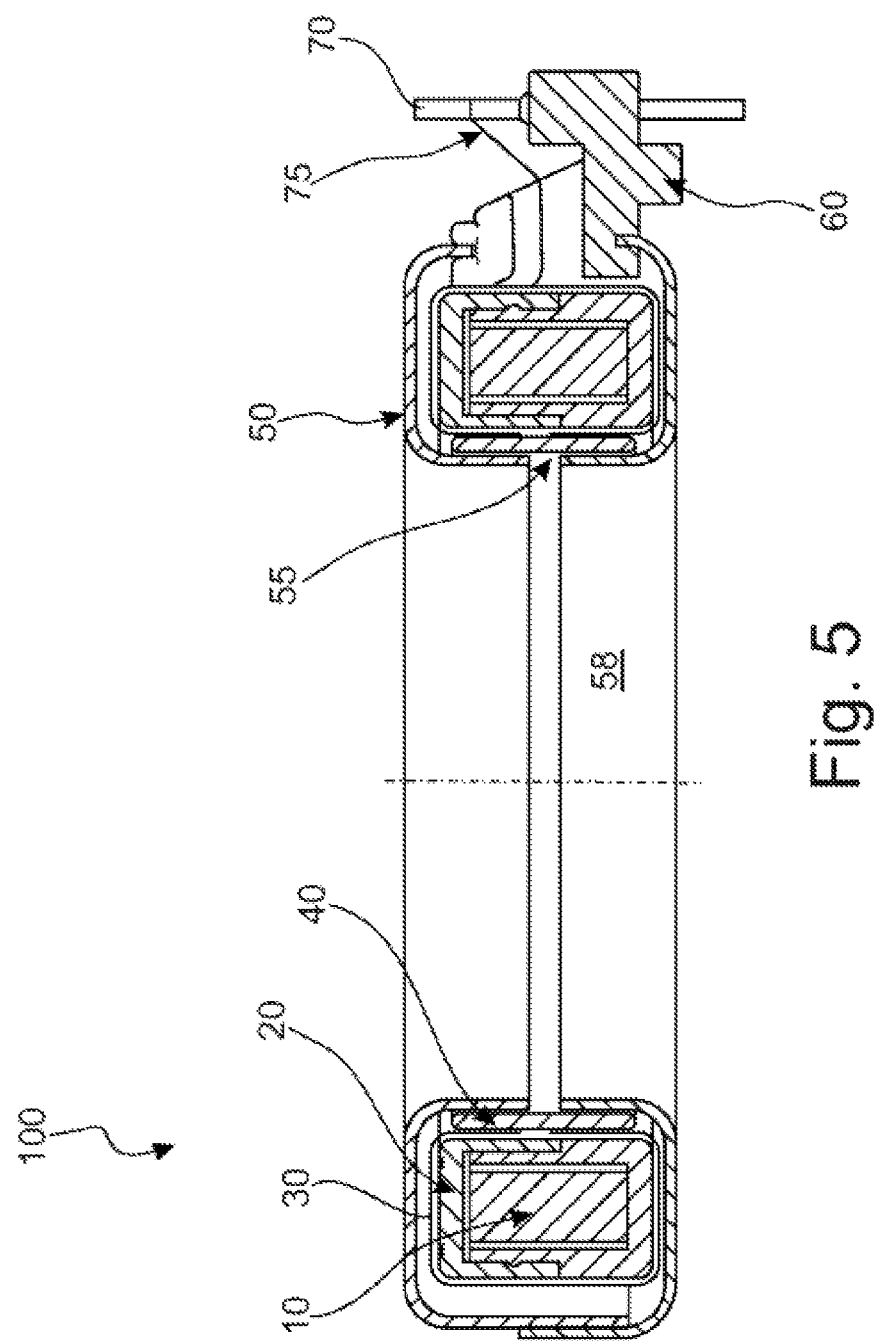
Figure 6:
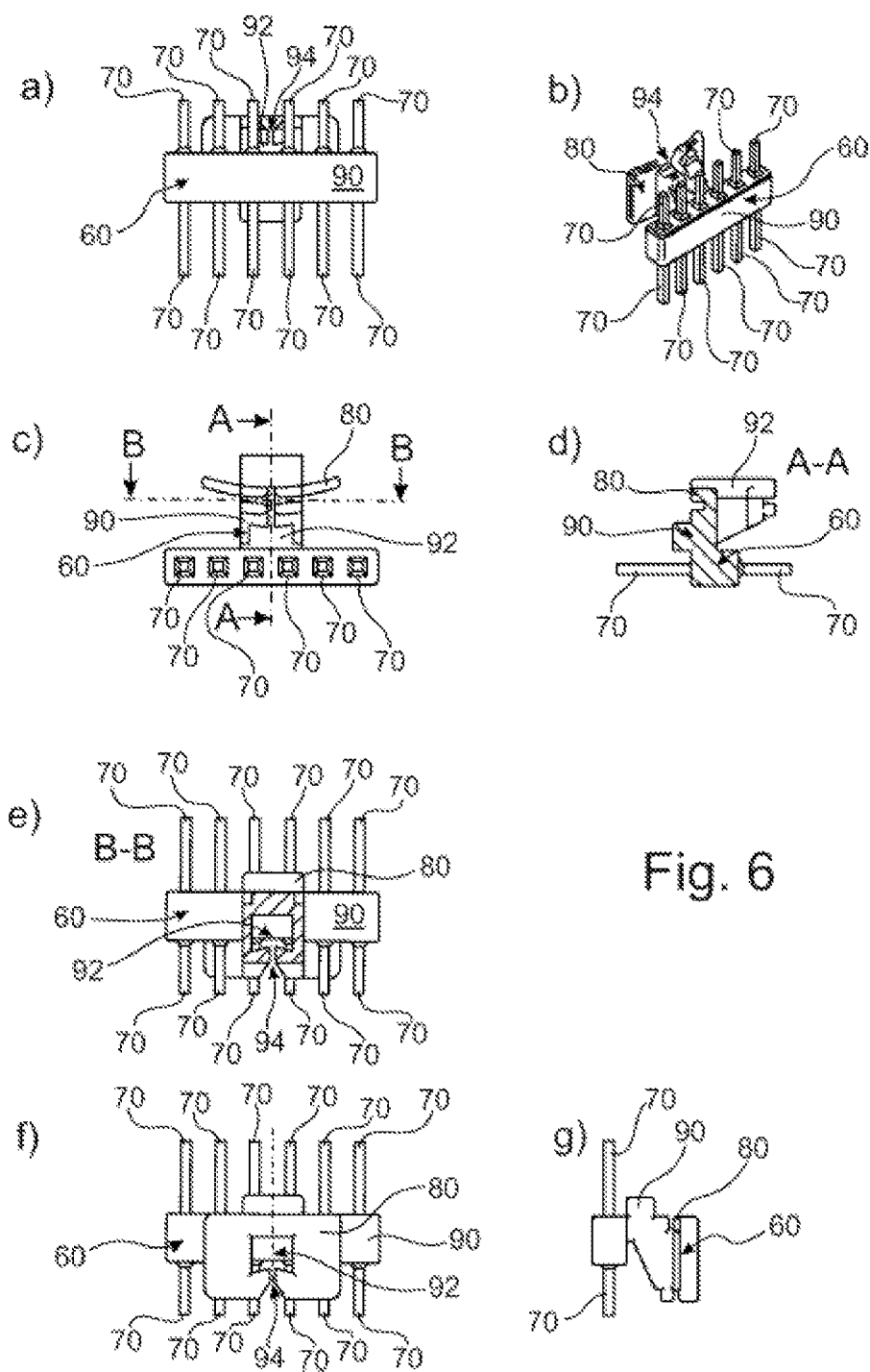

FIG. 3 schematically shows a dynamic development of the magnetic flux density over time, upon closing the electrical circuit, at a point, by way of example, in the magnetic field-sensitive component;

FIG. 4 schematically shows the physical correlation between the clear width of the magnetic field-sensitive component, the curve of the tendency of the sensor to incorrect activation depending on the clear width, and the curve of the smallest measurable differential current of a sensor depending on the clear width;

FIG. 5 is a schematic cross section of a sensor according to the invention;

FIG. 6 shows various schematic views of an electrical connector.

In the following description, the same reference signs refer to identical components or features, and therefore a description given with reference to one figure, with respect to a component, also applies for the other figures, and therefore a repeated description is omitted. Furthermore, the individual features which have been described in connection with one embodiment can also be used separately in other embodiments.

Figure 1:
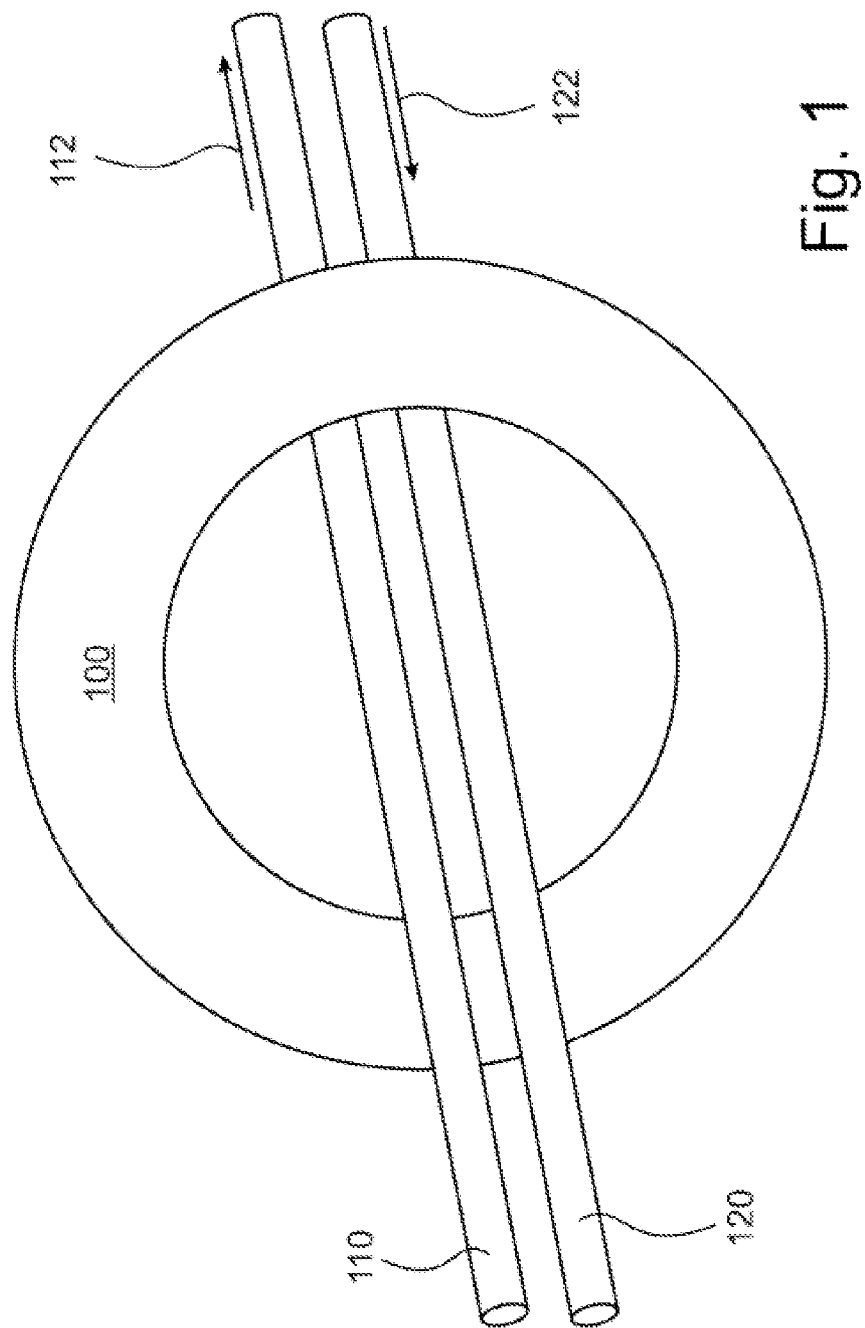
FIG. 1 is a schematic view of an arrangement of the sensor according to the invention in an electrical circuit.

The sensor 100, shown schematically in FIG. 1, is arranged around the electrical conductors 110, 120, through which a designated electrical current 112, 114 flows into and back out of the electrical circuit (not shown) monitored by the sensor 100.

In this case, the electrical current 112 flows into the electrical circuit (not shown), monitored by the sensor 100, via the phase conductor 110, and back out via the neutral conductor 120.

Figure 2:
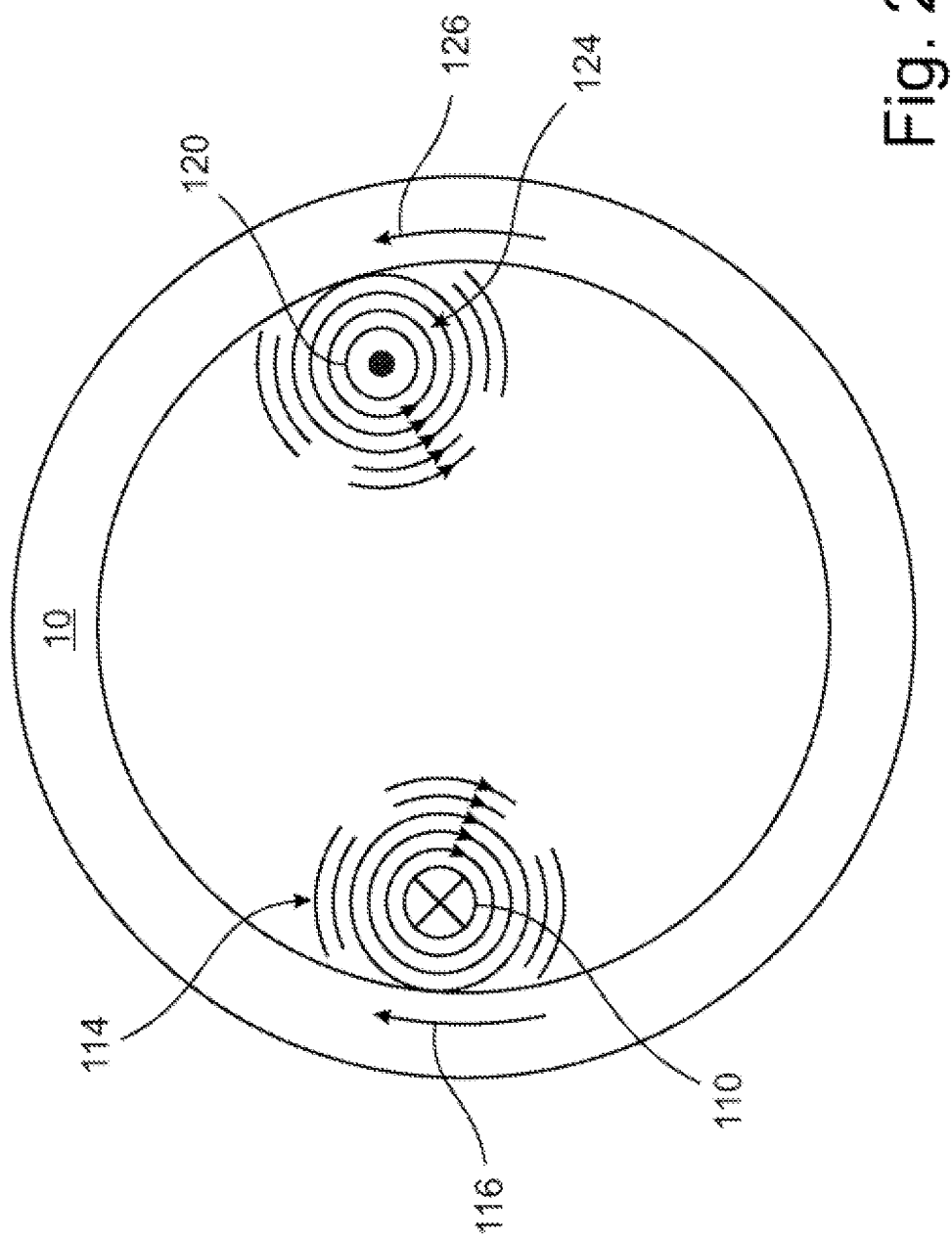
FIG. 2 is a schematic view of a physical operative connection upon closing the electrical circuit.

Upon activation of the voltage supply (not shown) in an electrical circuit (not shown), a dynamic physical operative connection results, in FIG. 2, between the magnetic fields 114, 124 arising around the electrical conductors 110, 120, and the regional magnetic flux density 116, 118 in the magnetic field-sensitive component 10.

The magnetic fields 114, 124 emanating from the electrical conductors 110, 120 influence the magnetic field-sensitive component 10, upon activation of the voltage supply (not shown), regionally and in a time-limited manner, in different ways, such that briefly regionally opposing magnetic flux densities 116, 126 are established in the magnetic field-sensitive component 10.

During the compensation process thereof, in FIG. 3, over time 130, considered at a point by way of example (not shown) in the magnetic field-sensitive component 10, the brief regionally opposing magnetic flux densities 116, 126 in the magnetic field-sensitive component 10 lead to dynamic behavior of the magnetic flux density in the form of an oscillation of the magnetic flux density 132.

This oscillation of the magnetic flux density 132, as a result of the activation of the current supply (not shown) for the electrical circuit considered (not shown), proceeds in a damped manner, and approaches the temporal threshold value thereof along the asymptotes 132, 134.

In this case, the brief oscillation of the magnetic flux density 132 also leads to a physical interaction (not shown) with the test winding (not shown) and/or the first main winding and/or a second main winding, resulting in a sensor signal (not shown), which can be interpreted as a differential current (not shown) that exceeds a defined threshold value (not shown). This can also be described as an activation fault.

The correlation, shown in FIG. 4, between the clear width 12 of the through-opening (not shown) of the magnetic field-sensitive component 10, the tendency to incorrect activation 140 of a circuit breaker (not shown) designated to use the sensor 100, and the smallest differential current 150 that can be measured by the sensor 100, shows that there is an optimal value 160 for the clear width 12 of the through-opening (not shown) of the magnetic field-sensitive component 10, at which a good compromise is found between the smallest measurable differential current 150 and the tendency to incorrect activation 140.

In the view shown schematically here, said optimal value 160 is located at the intersection of the curves 142, 152.

Furthermore, an optimal range 165 for the clear width 12 of the through-opening (not shown) of the magnetic field-sensitive component 10 results, which is arranged around the optimal value 160.

The sensor 100 in FIG. 5 essentially consists of a magnetic field-sensitive component 10, an insulator 20 that surrounds the magnetic field-sensitive component 10, a main winding 30, a test winding (not shown), a spacer ring 40, a shield 50, an electrical connector 60, and a plurality of electrical contacts 70.

The insulator 20 is formed in two parts, the individual parts (not shown) of the insulator 20 being interconnected in a form-fitting manner.

The main winding 30 is connected by means of an electrical wire 75 to the electrical contact 70 which is borne by the electrical connector 60.

The shield 50 is formed in two parts and forms a peripheral gap 55 on the shield inside wall 58.

The electrical connector 60 in FIG. 6 essentially consists of a support plate 80, a connector neck 90, and a plurality of electrical contacts 70.

Letter b) in FIG. 6 is a three-dimensional view of the electrical connector 60.

Letter a) in FIG. 6 is a front view of the electrical connector 60, the front view being shown viewed from the outside, with respect to the designated sensor.

Letter c) in FIG. 6 is a plan view of the electrical connector 60. Furthermore, the cutting guides A-A and B-B are shown.

Letter d) shows the section A-A through the electrical connector 60.

Letter e) shows the section B-B through the electrical connector 60.

Letter f) in FIG. 6 is a front view of the electrical connector 60, the front view being shown viewed from the inside, with respect to the designated sensor.

Letter g) in FIG. 6 is a side view of the electrical connector 60.

The support plate 80 is designed to be received in the receiving space (not shown) of the shield (not shown).

The connector neck 90 connects the plurality of electrical contacts 70 to the support plate 80.

The connector neck 90 comprises a recess 92 which is designed for receiving the two electrical wires (not shown), which are operatively connected to each winding (not shown), from the receiving space (not shown), and guiding these to the electrical contacts (70), from the receiving space (not shown) and through the opening (not shown) in the shield outside wall (not shown).

The recess 92 further comprises a notch 94, in a direction in parallel with the shield outside wall (not shown), through which notch the electrical wires (not shown) can be inserted into a central region (not shown) of the recess 92.

The notch 94 makes it possible to insert electrical wires (not shown) transversely into the recess 92, individually or in bundles, in a simple manner, it being necessary, in the process, for each individual electrical wire (not shown) to pass the notch 94 at the constriction (not shown) thereof. In this case, the constriction (not shown) of the notch 94 is designed such that an electrical wire (not shown), once inserted into the recess 92, can leave the recess 92 again, transversely to the longitudinal direction (not shown) of the recess 92, only with significant effort, and thus remains in the protective region (not shown) of the recess 92, in a designated manner.

LIST OF REFERENCE SIGNS

10 magnetic field-sensitive component
12 clear width
20 insulator
30 main winding
40 spacer ring
50 shield
55 peripheral gap
58 shield inside wall
60 electrical connector
70 electrical contact
75 electrical wire
80 support plate
90 connector neck
92 recess
94 notch
100 sensor
110 electrical conductor/phase conductor
112 direction of the electrical current
114 magnetic field
116 magnetic flux density
120 electrical conductor/neutral conductor
122 direction of the electrical current
124 magnetic field
126 magnetic flux density
130 time axis
132 oscillation of the magnetic flux density
134 asymptote
136 asymptote
140 tendency to incorrect activation
142 curve of the tendency to incorrect activation
150 smallest measurable differential current
152 curve of the smallest measurable differential current
160 optimal value
165 optimal range

The invention claimed is:
1. An apparatus comprising:
a sensor for the universal-current sensitive determination of an electric differential current, the sensor comprising a magnetic field-sensitive component, a first main winding, a test winding, and a shield,
the magnetic field-sensitive component comprising a through-opening, the through-opening of the magnetic field-sensitive component being formed, in cross section, as an oval having two axes of symmetry,
the first main winding and the test winding surrounding the magnetic field-sensitive component by means of a plurality of windings in each case,
the shield comprising a receiving space which is designed for receiving the magnetic field-sensitive component, the first min winding, and the test winding,
the receiving space of the shield being delimited, in the radial direction, by a shield outside wall and a shield inside wall,
the shield inside wall defining a through-opening of the shield, the through the shield being formed as an oval having two axes of symmetry,
the shield comprising a peripheral gap in the region of the shield inside wall,
the sensor being designed for being arranged around at least two electrical conductors,
the through-opening of the magnetic field-sensitive component, having at least one clear width along an axis of symmetry,
wherein
the at least one clear width is in a range between 25.2 and 32 mm.
2. The apparatus according to claim 1, characterized in that the magnetic field-sensitive component is encased by an insulator, the insulator being arranged between the magnetic field-sensitive component and the first, main winding, and between the magnetic field-sensitive component and the test winding.

3. The apparatus according to claim 2, wherein the sensor comprises a second main winding, the second main winding surrounding the magnetic field-sensitive component and/or the insulator by means of a plurality of windings.

4. System according to claim 1, wherein the sensor comprises a spacer ring, the spacer ring being arranged between the shield inside wall and the first main winding.

5. The apparatus according to claim 1, wherein the shield comprises a coating.

6. The apparatus to claim 1, wherein the shield has a material thickness in a range between 0.25 mm and 0.45 mm.

7. The apparatus according to claim 1, wherein the peripheral gap has a gap width in a range between 0.1 mm and 2.0 mm.

8. System according to claim 1, wherein the sensor comprises an electrical connector, the electrical connector comprising a support plate, a connector neck, and a plurality of electrical contacts,
- the electrical connector comprising two electrical contacts, at least for each winding,
- the electrical contacts being arranged outside the shield outside wall, in the radial direction,
- the support plate being arranged between the shield outside wall and the first main winding,
- the connector neck extending through an opening in the shield outside wall and interconnecting the support plate and the electrical contacts,
- the support plate and the connector neck each comprising a corresponding recess (92), the recess (92) being designed for receiving the two electrical wires, which are operatively connected to each winding, from the receiving space, and guiding these to the electrical contacts, from the receiving space and through the opening in the shield outside wall,
- the recess comprising a notch, in a direction in parallel with the shield outside wall, through which notch the electrical wires can be inserted into a central region of the recess.

9. Circuit breaker for interrupting an electrical circuit in the case of differential currents in the electrical circuit exceeding a threshold value, comprising a sensor according to claim 1, an operating circuit, an electronic data processing and analysis unit, and a switching apparatus,
- wherein the sensor is arranged around at least two electrical conductors which form the electrical circuit,
- the switching apparatus being designed for interrupting the electrical circuit,
- wherein the operating circuit is designed for operating the sensor,
- wherein the electronic data processing and analysis unit is designed for analyzing sensor signals of the sensor,
- wherein the electronic data processing and analysis unit is designed, upon identification of an electrical differential current, in particular in the case of universal-current sensitive identification of a differential current, having a current strength greater than the threshold value, to actuate the switching apparatus such that the switching apparatus interrupts the electrical circuit.

10. The apparatus according to claim 1 further comprising a charging cable for charging an electric vehicle.

11. The apparatus according to claim 1 further comprising a charging station for charging an electric vehicle.

12. The apparatus according to claim 9 further comprising a charging cable for charging an electric vehicle.

13. The apparatus according to claim 9 further comprising a charging station for charging an electric vehicle.

14. The apparatus according to claim 1 wherein the at least one clear width is in a range between 25.5 and 29 mm.

15. The apparatus according to claim 1 wherein the at least one clear width is in a range between 25.8 and 27 nm.

16. The apparatus according to claim 5, wherein the shield comprises an electrically insulating coating.

17. The apparatus according to claim 1, wherein the shield has a material thickness in a range between 0.3 mm and 0.4 mm.

18. The apparatus according to claim 1, wherein the shield has a material thickness in a range between 0.32 mm and 0.38 mm.

19. The apparatus according to claim 1, wherein the peripheral gap has a gap width in a range between 0.3 mm and 1.7 mm.

20. The apparatus according to claim 9 wherein the threshold value is an adjustable threshold value.

* * * * *